United States Patent [19]
Ichikawa

[11] Patent Number: 4,979,802
[45] Date of Patent: Dec. 25, 1990

[54] SYNTHETIC RESIN HALF-MIRROR
[75] Inventor: Hajime Ichikawa, Sagamihara, Japan
[73] Assignee: Olympus Optical Company Limited, Japan
[21] Appl. No.: 488,535
[22] Filed: Feb. 28, 1990

Related U.S. Application Data

[63] Continuation of Ser. No. 192,596, May 7, 1988, abandoned.

[30] Foreign Application Priority Data

Jun. 4, 1987 [JP] Japan .................................. 62-140603
Sep. 11, 1987 [JP] Japan .................................. 62-227859

[51] Int. Cl.⁵ ............................ G02B 5/28; G02B 1/10
[52] U.S. Cl. ..................................... 350/164; 428/333
[58] Field of Search ................ 428/333; 350/164, 165, 350/166, 642

[56] References Cited

U.S. PATENT DOCUMENTS 2,366,687  1/1945 Osterberg ............................. 350/164
3,356,522 12/1967 Libbert ............................. 350/164 X
4,196,246  4/1980 Takayama et al. .................. 350/164
4,372,642  2/1983 Singer et al. ........................ 350/164

Primary Examiner—Bruce Y. Arnold
Assistant Examiner—Martin Lerner
Attorney, Agent, or Firm—Bruce L. Adams; Van C. Wilks

[57] ABSTRACT

A synthetic resin half-mirror comprises a synthetic resin substrate, a first SiO film layer deposited thereon, and further at least two $SiO_2$ layers and $CeO_2$ film layers alternately deposited thereon and satisfies a spectral reflectance at incident angle of 45° of not less than 40% as an optical property.

12 Claims, 4 Drawing Sheets

SYNTHETIC RESIN HALF-MIRROR

This is a Rule 62 continuation of parent application Ser. No. 192,596 filed May 7, 1988, now abandoned.

BACKGROUND OF THE INVENTION

1. Field of the Invention

This invention relates to a half-mirror made of a synthetic resin.

2. Related Art Statement

Heretofore, a half-mirror has been manufactured by alternately depositing a $TiO_2$ layer and a $SiO_2$ layer, for example, onto a heated glass substrate under vacuum through an electron gun process.

Lately, synthetic resins having a light weight and an easy workability have frequently been used as a material for optical parts such as lens and like instead of the glass. However, the optical parts made from the synthetic resin are apt to be damaged because the surface is soft, so that it is required to form a cured protective film layer on the surface of the optical part. Among the optical parts, the half-mirror is produced by forming a semi-permeable reflective film layer on the surface of the substrate made from the synthetic resin and is used in a camera, spectrometer, light interference film pressure meter or the like. In this case, it is necessary to form a reflection preventive film, reflection increase film, semi-permeable film or the like on the surface of the half-mirror.

These films are generally formed by a vacuum deposition process, but when the substrate is made from the synthetic resin, it is impossible to form the deposited film on the substrate by forcedly heating the substrate as in the case of a glass substrate, because the synthetic resin substrate itself is degraded and decomposed by heating. If the synthetic resin substrate is subjected to a deposition process without heating, since a greater part of the depositing materials used for glass are dielectric substances capable of forming film by heating such as oxides, fluorides and the like, micro cracks are produced in the resulting deposited film after the deposition, which is particularly remarkable in case of acrylic resins or the like for injection molding. Moreover, even if abnormal phenomenon is not observed in the deposited film, micro cracks occur during the thermal shock test of the optical part after the deposition. Particularly, if it is intended to form a $TiO_2$ film on the substrate, since radiant heat is high, the synthetic resin substrate is degraded or deformed by vacuum deposition over a long period of time and consequently the use of the substrate itself is impossible.

Heretofore, the half-mirror made from the synthetic resin produced by forming the film on the surface of the synthetic resin substrate without heating the substrate has been proposed, for example, in Japanese patent laid open No. 60-225101 and 61-110101.

The synthetic resin half-mirror described in Japanese Patent laid open No. 60-225,101 is produced by forming silicon monooxide (SiO) film on the surface of the substrate made of acrylic resin through reaction deposition of oxygen ($O_2$) and then alternately laminating a ditantalum penta oxide ($Ta_2O_5$) film and a silicon dioxide ($SiO_2$) films thereon. On the other hand, the synthetic resin half-mirror described in Japanese Patent laid open No. 61-110,101 is produced by forming a primer and hard coat film (thickness: 5 $\mu g/m^2$) of a silicon paint on the surface of the substrate made of methacrylic resin and further forming a dielectric thin film of titanium dioxide ($TiO_2$) thereon through reactive sputtering of Ti metal as a target.

In the half-mirror of Japanese Patent laid open No. 60-225,101, however, micro cracks occur in the film after the thermal shock test of repeating a temperature cycle of $-30°$ C. room temperature ($20° \sim 25°$ C.)$\rightarrow 80°$ C. ten times. Furthermore, since $Ta_2O_5$ is high in the melting point, when the vacuum deposition is performed by an electron gun process, the splushing (adhesion of $Ta_2O_5$ in form of granules, resulting in the falling off from the film) is apt to be caused and there is a problem in the resulting appearance. Furthermore, the synthetic resin substrate is not heated so as to prevent the degradation and decomposition of the substrate, but it is influenced by a radiant heat. Therefore, it is required to be a long distance from the deposition source for avoiding the influence of the radiant heat and also to perform the cooling of every layer deposited without continuously forming multilayer films through vacuum deposition, resulting in the reconstruction of the device, the decrease of working efficiency and the like.

On the other hand, in the half-mirror described in Japanese Patent laid open No. 61-110,101, $TiO_2$ film is formed on the primer and hard layer through the sputtering of Ti metal, so that it is difficult to hold the surface shape having an optical accuracy, particularly a lens shape, after the film formation due to the presence of the undercoat.

SUMMARY OF THE INVENTION

It is, therefore, an object of the invention to solve the aforementioned drawbacks of the conventional techniques and to provide a synthetic resin half-mirror having a good bonding property between the film layers and between the substrate and the film layer, improved cracking resistance, and spectral reflectance (45° entrance) of not less than 40% an preventing the degradation and deformation of the substrate.

According to the invention, there is the provision of a synthetic resin half-mirror comprising a substrate made from a synthetic resin, a first film layer laminated thereon and made from SiO and at least four film layers laminated on the first film layer and alternately made from $SiO_2$ and $CeO_2$.

In a preferred embodiment of the invention, the first film layer of SiO has an optical thickness of $nd = \lambda/12 \sim \lambda/2$ and the second film layer of $SiO_2$ has an optical thickness of $nd = \lambda/8 \sim \lambda/4$.

Moreover, the formation of these film layers is carried out by a vacuum deposition method at room temperature ($25°$ C.$\pm 5°$ C.) without forcedly heating the substrate, whereby the degradation and deformation of the substrate and the occurrence of micro cracks in the film layer can be prevented. In this case, the first film layer is preferably formed by a resistance heating process, and each of at least four film layers is preferably formed by an electron gun process.

In the synthetic resin half-mirror of the above structure according to the invention, the bonding property between the substrate and the film layer or between mutual film layers is increased and the crack resistance of the film layer is improved and also the spectral reflectance at entrance of 45° becomes not lower than 40%.

BRIEF DESCRIPTION OF THE DRAWINGS

The invention will be described with reference to the accompanying drawings, wherein.

DESCRIPTION OF THE PREFERRED EMBODIMENTS

Figure 1:
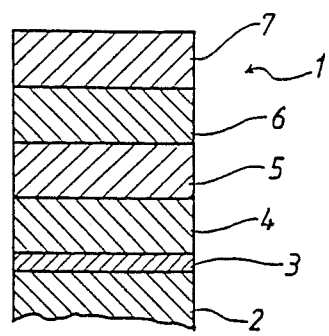
FIG. 1 is a longitudinal section view of a first embodiment of the synthetic resin half-mirror according to the invention.

In FIG. 1 is shown a first embodiment of the synthetic resin half-mirror according to the invention used for a light at an incident angle of 45°. This half-mirror 1 is constructed by depositing five film layers 3~7 onto a synthetic resin substrate 2 at room temperature (20°~25° C.) under a vacuum of $1 \times 10^{-5} \sim 2 \times 10^{-5}$ Torr.

The synthetic resin substrate 2 is made from an acrylic resin having a refractive index of n=1.49, onto the surface of which is deposited a first film layer 3 made of SiO through a resistance heating process. Then, a second film layer 4 made of $SiO_2$ is deposited onto the first film layer 3 through an electron gun process and a third film layer 5 made of $CeO_2$ is deposited onto the second film layer 4 through an electron gun process. Furthermore, a fourth film layer 6 made of $SiO_2$ is formed on the third film layer 5 and a fifth film layer 7 made of $CeO_2$ and defining the incident-light surface of the half-mirror is formed on the fourth film layer 6 through the same electron gun process as described above. In the first embodiment, when the design wavelength is $\lambda_o$=600 nm, the refractive index (n) and optical thickness (nd) of each of these film layers are set as shown in the following Table 1.

TABLE 1

| Incident | Refractive index, n | Optical thickness nd (nm) | Substance |
|---|---|---|---|
| medium (A) | 1.00 | | air |
| Fifth layer | 1.95 | 150 | $CeO_2$ |
| Fourth layer | 1.46 | 150 | $SiO_2$ |
| Third layer | 1.95 | 150 | $CeO_2$ |
| Second layer | 1.46 | 150 | $SiO_2$ |
| First layer | 1.80 | 50 | SiO |
| Substrate | 1.49 | | acrylic resin |

Figure 2:
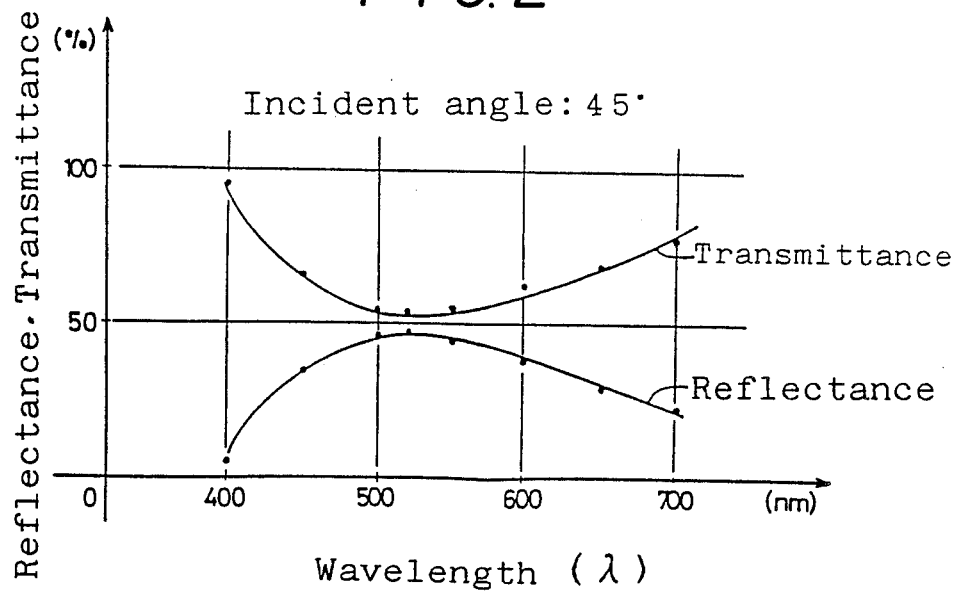
FIG. 2 is a graph showing the spectral characteristics of the half-mirror of FIG. 1.

The spectral characteristics of the thus obtained half-mirror at an incident angle of 45° (reflectance, transmittance) are shown in FIG. 2. As seen from FIG. 2, the optical characteristics having reflectance of 45% and transmittance of 55% can be obtained. Furthermore, there is caused no micro crack in the film layer and no deformation and degradation of the substrate. Moreover, the change of the optical characteristics is hardly caused with the lapse of time and the reflectance of 45% and transmittance of 55% as the initial performance are satisfactorily maintained. Even when the half-mirror is subjected to a thermal shock test repeating a temperature cycle of −30° C.→room temperature (20°~25° C.)→80° C. ten times, there are not caused the occurrence of micro cracks and the deformation and degradation of the substrate.

Figure 3:
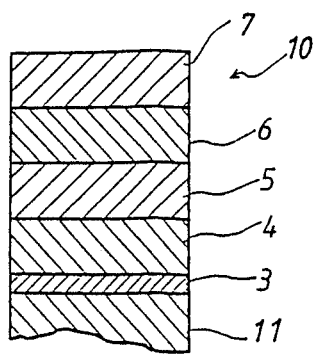
FIG. 3 is a longitudinal section view of a second embodiment of the synthetic resin half-mirror according to the invention.

In FIG. 3 is shown a second embodiment of the synthetic resin half-mirror according to the invention used for a light at an incident angle of 45°.

In this half-mirror 10, the synthetic resin substrate 11 is made from a polycarbonate resin having a refractive index of n=1.58. Onto the surface of the substrate 11 are deposited five film layers 3 to 7 at room temperature (20°~25° C.) under a high vacuum of $1 \times 10^{-5} \sim 2 \times 10^{-5}$ Torr in the same manner as in the first embodiment. That is, the first film layer 3 of SiO is formed on the substrate 11 through a resistance heating process, and then $SiO_2$ (second film layer 4), $CeO_2$ (third film layer 5), $SiO_2$ (fourth film layer 6) and $CeO_2$ (fifth film layer 7) are successively formed on the first film layer 3 through an electron gun process.

The refractive index (n) and optical thickness (nd) of each of these film layers are shown in the following Table 2. Moreover, $\lambda_o$ is a design wavelength.

TABLE 2

| Incident | Refractive index, n | Optical thickness nd (nm) | Substance |
|---|---|---|---|
| medium (A) | 1.00 | | air |
| Fifth layer | 1.95 | 150 | $CeO_2$ |
| Fourth layer | 1.46 | 150 | $SiO_2$ |
| Third layer | 1.95 | 150 | $CeO_2$ |
| Second layer | 1.46 | 150 | $SiO_2$ |
| First layer | 1.80 | 50 | SiO |
| Substrate | 1.58 | | polycarbonate |

Figure 4:
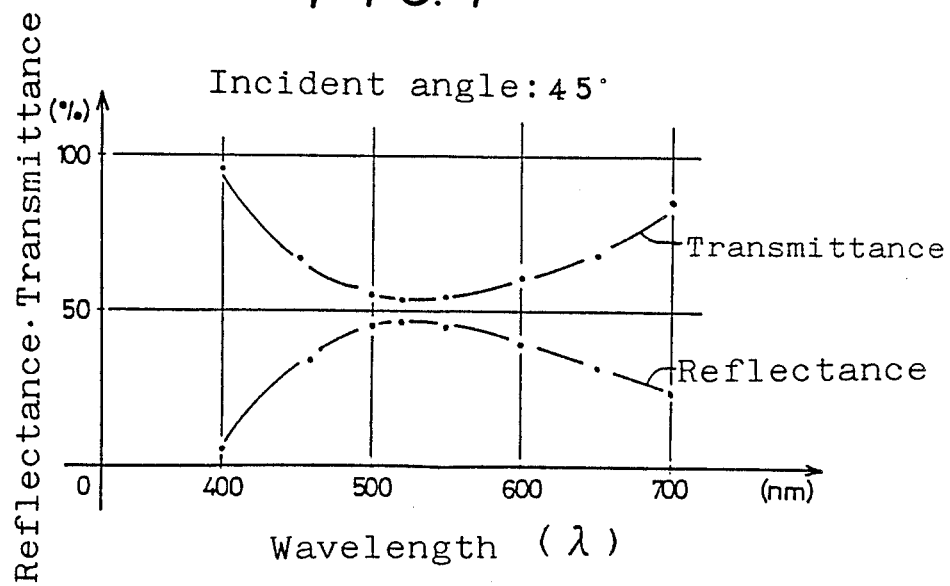
FIG. 4 is a graph showing the spectral characteristics of the half-mirror of FIG. 3.

The spectral characteristics (reflectance, transmittance) of the thus obtained half-mirror at an incident angle of 45° are shown in FIG. 4. As seen from FIG. 4, the half-mirror has satisfactory initial performances and durability performance likewise the case of the first embodiment.

Figure 5:
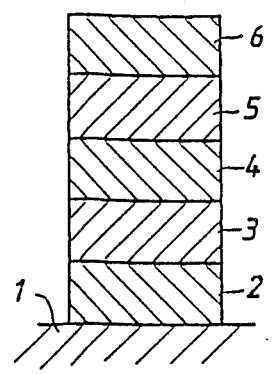
FIG. 5 is a longitudinal section view of a third embodiment of the synthetic resin half-mirror according to the invention.

The third embodiment of the synthetic resin half-mirror according to the invention for a light at an incident angle of 45° is shown in FIG. 5 and the following Table 3. Moreover, the design wavelength is $\lambda_o$=600 nm.

TABLE 3

| Incident | Refractive index, n | Optical thickness nd (nm) | Substance |
|---|---|---|---|
| medium | 1.00 | | air |
| Fifth layer | 1.95 | 150 | $CeO_2$ |
| Fourth layer | 1.46 | 150 | $SiO_2$ |
| Third layer | 1.95 | 150 | $CeO_2$ |
| Second layer | 1.46 | 150 | $SiO_2$ |
| First layer | 1.80 | 150 | SiO |
| Substrate | 1.49 | | acrylic resin |

In the third embodiment, the substrate 2 is made from an acrylic resin having a refractive index of n=1.49, onto which is deposited a first film layer 3 of SiO having an optical thickness of nd=150 nm under a high vacuum of $1 \sim 2 \times 10^{-5}$ Torr through a resistance heating process. Furthermore, the first film layer 3 of SiO, second film layer 4 of $SiO_2$, third film layer 5 of $CeO_2$, fourth film layer 6 of $SiO_2$ and fifth film layer 7 of $CeO_2$ are successively formed by vacuum deposition through an electron gun process, respectively.

Figure 6:
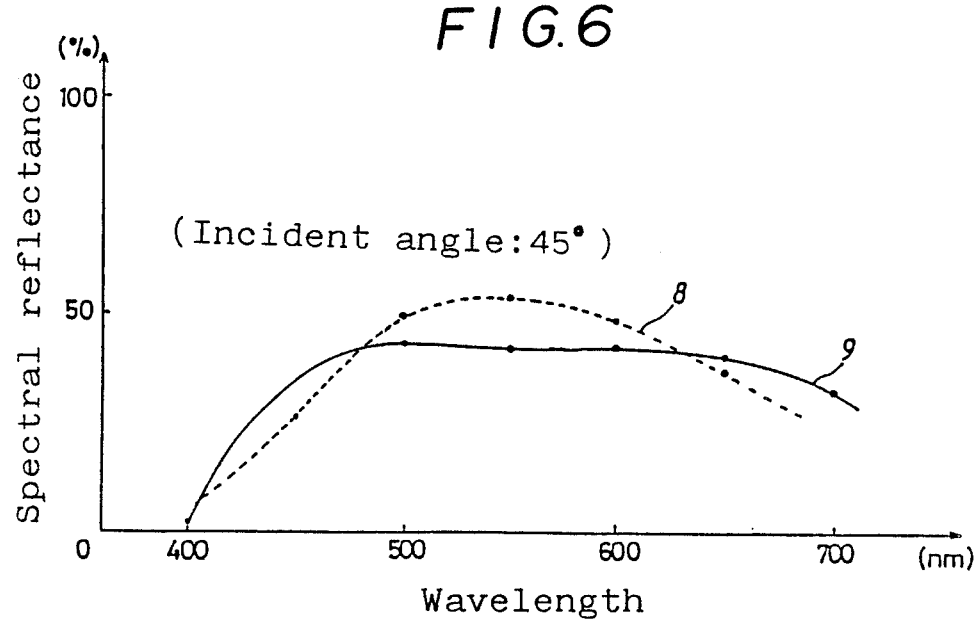
FIG. 6 is a graph of optical characteristics showing spectral reflectances of the third to fourth embodiments of the half-mirror according to the invention.

In the synthetic resin half-mirror of the third embodiment, the spectral reflectance at an incident angle of 45° is not less than 40% (peak value) as shown by dotted lines 8 in FIG. 6.

The fourth embodiment of the synthetic resin half-mirror has a five layer structure for a light at an incident angle of 45° as shown in the following Table 4. Moreover, the design wavelength is $\lambda_o = 600$ nm.

TABLE 4

| Incident | Refractive index, n | Optical thickness nd (nm) | Substance |
|---|---|---|---|
| medium | 1.00 | | air |
| Fifth layer | 1.95 | 150 | CeO$_2$ |
| Fourth layer | 1.46 | 150 | SiO$_2$ |
| Third layer | 1.95 | 150 | CeO$_2$ |
| Second layer | 1.46 | 150 | SiO$_2$ |
| First layer | 1.80 | 300 | SiO |
| Substrate | 1.49 | | acrylic resin |

In the fourth embodiment, the substrate is made from an acrylic resin having a refractive index of n=1.49, onto which is deposited the first film layer of SiO having an optical thickness of nd=300 nm under a high vacuum of $1 \sim 2 \times 10^{-5}$ Torr through a resistance heating process. Furthermore, the second film layer of SiO$_2$, third film layer of CeO$_2$, fourth film layer of SiO$_2$ and fifth film layer of CeO$_2$ are successively deposited through an electron gun process, respectively.

In the synthetic resin half-mirror of the fourth embodiment, the spectral reflectance at an incident angle of 45° is not less than 40% (peak value) as shown by a dot-dash line 9 in FIG. 6.

The fifth embodiment of the synthetic resin half-mirror has a seven layer structure for a light at an incident angle of 45° as shown in the following Table 5. Moreover, the design wavelength is $\lambda_o = 600$ nm.

TABLE 5

| Incident | Refractive index, n | Optical thickness nd (nm) | Substance |
|---|---|---|---|
| medium | 1.00 | | air |
| Seventh layer | 1.95 | 150 | CeO$_2$ |
| Sixth layer | 1.46 | 150 | SiO$_2$ |
| Fifth layer | 1.95 | 150 | CeO$_2$ |
| Fourth layer | 1.46 | 150 | SiO$_2$ |
| Third layer | 1.95 | 150 | CeO$_2$ |
| Second layer | 1.46 | 150 | SiO$_2$ |
| First layer | 1.80 | 150 | SiO |
| Substrate | 1.49 | | acrylic resin |

In the fifth embodiment, the substrate is made from an acrylic resin having a refractive index of n=1.49, onto which is deposited the first film layer of SiO having an optical thickness of nd=150 nm under a high vacuum of $1 \sim 2 \times 10^{-5}$ Torr through a resistance heating process. Furthermore, the second film layer of SiO$_2$, third film layer of CeO$_2$, fourth film layer of SiO$_2$, fifth film layer of CeO$_2$, sixth film layer of SiO$_2$ and seventh film layer of CeO$_2$ which defines the incident-light surface of the half-mirror are successively deposited through an electron gun process, respectively.

Figure 7:
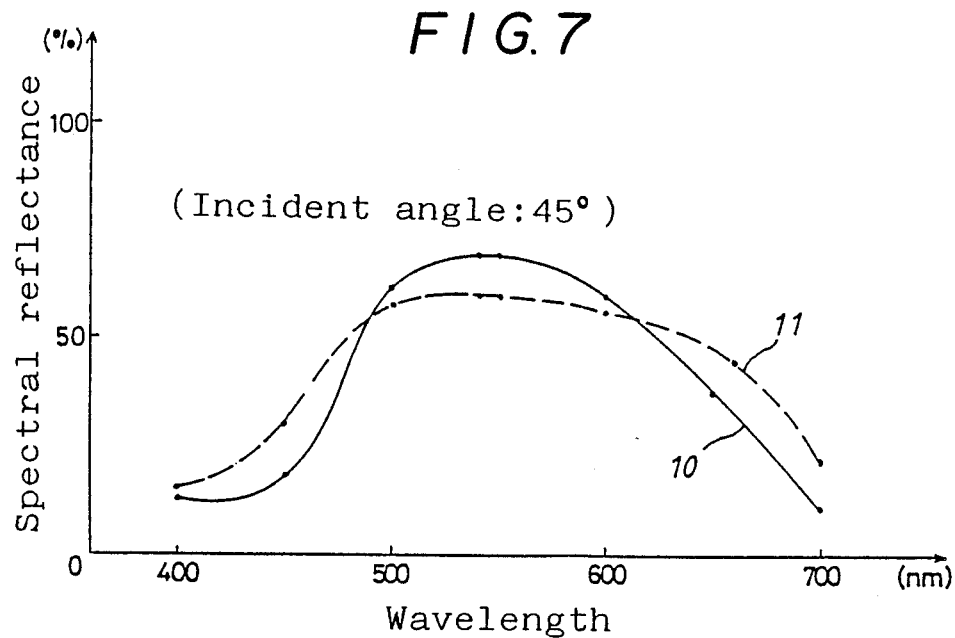
FIG. 7 is a graph of optical characteristics showing spectral reflectances of the fifth to sixth embodiments of the half-mirror according to the invention.

In the synthetic resin half-mirror of the fifth embodiment, the spectral reflectance at an incident angle of 45° is not less than 40% (peak value) as shown by a solid line 10 in FIG. 7.

The sixth embodiment of the synthetic resin half-mirror has a seven layer structure for a light at incident angle of 45° as shown in the following Table 6. Moreover, the design wavelength is $\lambda_o = 600$ nm.

TABLE 6

| Incident | Refractive index, n | Optical thickness nd (nm) | Substance |
|---|---|---|---|
| medium | 1.00 | | air |
| Seventh layer | 1.95 | 150 | CeO$_2$ |
| Sixth layer | 1.46 | 150 | SiO$_2$ |
| Fifth layer | 1.95 | 150 | CeO$_2$ |
| Fourth layer | 1.46 | 150 | SiO$_2$ |
| Third layer | 1.95 | 150 | CeO$_2$ |
| Second layer | 1.46 | 150 | SiO$_2$ |
| First layer | 1.80 | 300 | SiO |
| Substrate | 1.49 | | acrylic resin |

In the sixth embodiment, the substrate is made from an acrylic resin having a refractive index of n=1.49, onto which is deposited the first film layer of SiO having an optical thickness of nd=300 nm under a high vacuum of $1 \sim 2 \times 10^{-5}$ Torr through a resistance heating process. Furthermore, the second film layer of SiO$_2$, third film layer of CeO$_2$, fourth film layer of SiO$_2$, fifth film layer of CeO$_2$, sixth film layer of SiO$_2$ and seventh film layer of CeO$_2$ are successively deposited through an electron gun process, respectively.

In the synthetic resin half-mirror of the fifth embodiment, the spectral reflectance at an incident angle of 45° is not less than 40% (peak value) as shown by a broken line 11 in FIG. 7.

The seventh embodiment of the synthetic resin half-mirror has a five layer structure for a light at an incident angle of 45° as shown in the following Table 7. Moreover, the design wavelength is $\lambda_o = 600$ nm.

TABLE 7

| Incident | Refractive index, n | Optical thickness nd (nm) | Substance |
|---|---|---|---|
| medium | 1.00 | | air |
| Fifth layer | 1.95 | 150 | CeO$_2$ |
| Fourth layer | 1.46 | 150 | SiO$_2$ |
| Third layer | 1.95 | 150 | CeO$_2$ |
| Second layer | 1.46 | 150 | SiO$_2$ |
| First layer | 1.80 | 150 | SiO |
| Substrate | 1.49 | | polycarbonate |

In the seventh embodiment, the substrate is made from a polycarbonate resin having a refractive index of n=1.58, onto which is deposited the first film layer of SiO having an optical thickness of nd=150 nm under a high vacuum of $1 \sim 2 \times 10^{-5}$ Torr through a resistance heating process. Furthermore, the second film layer of SiO$_2$, third film layer of CeO$_2$, fourth film layer of SiO$_2$ and fifth film layer of CeO$_2$ are successively deposited through an electron gun process, respectively.

Figure 8:
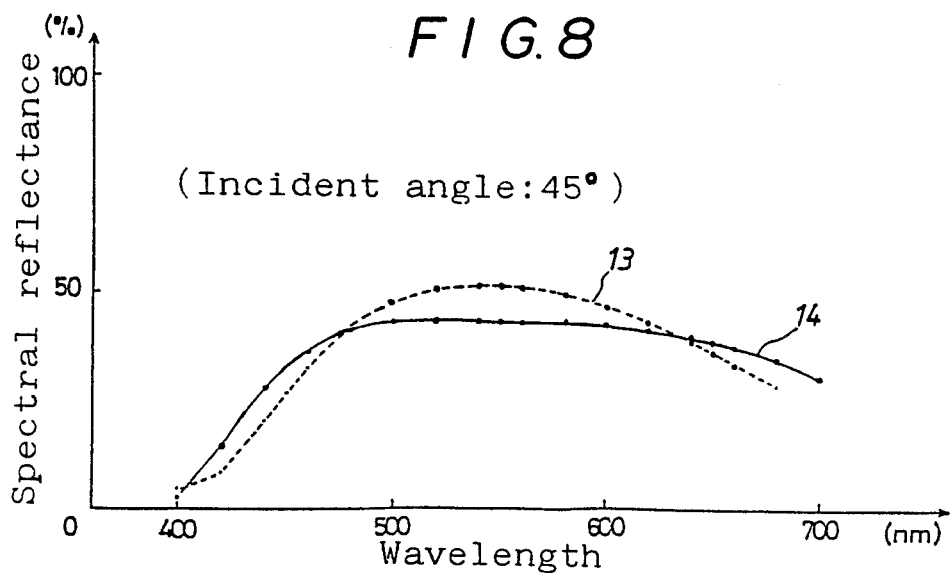
FIG. 8 is a graph of optical characteristics showing spectral reflectances of the seventh to eighth embodiments of the half-mirror according to the invention.

In the synthetic resin half-mirror of the seventh embodiment, the spectral reflectance at an incident angle of 45° is not less than 40% (peak value) as shown by a broken line 13 in FIG. 8.

The eighth embodiment of the synthetic resin half-mirror has a five layer structure for a light at an incident angle of 45° as shown in the following Table 8. Moreover, the design wavelength is $\lambda_o = 600$ nm.

TABLE 8

| Incident | Refractive index, n | Optical thickness nd (nm) | Substance |
|---|---|---|---|
| medium | 1.00 | | air |
| Fifth layer | 1.95 | 150 | $CeO_2$ |
| Fourth layer | 1.46 | 150 | $SiO_2$ |
| Third layer | 1.95 | 150 | $CeO_2$ |
| Second layer | 1.46 | 150 | $SiO_2$ |
| First layer | 1.80 | 300 | SiO |
| Substrate | 1.49 | | polycarbonate |

In the eighth embodiment, the substrate is made from a polycarbonate resin having a refractive index of n=1.58, onto which is deposited the first film layer of SiO having an optical thickness of nd=300 nm under a high vacuum of $1\sim 2\times 10^{-5}$ Torr through a resistance heating process. Furthermore, the second film layer of $SiO_2$, third film layer of $CeO_2$, fourth film layer of $SiO_2$ and fifth film layer of $CeO_2$ are successively deposited through an electron gun process, respectively.

In the synthetic resin half-mirror of the eighth embodiment, the spectral reflectance at an incident angle of 45° is not less than 40% (peak value) as shown by a dot-dash line 14 in FIG. 8.

In all of the synthetic resin half-mirrors of the above embodiments, the occurrence of micro cracks is not caused in the film layer as an appearance property, and also the peeling of the film layer is not caused by the tape peeling test. Furthermore, there is not observed the deformation and degradation of the substrate. Moreover, the change of optical properties with the lapse of time is not observed after the durability test.

As mentioned above, in the synthetic resin half-mirror according to the invention, the first SiO film layer is formed on the synthetic resin substrate and further at least two $SiO_2$ film layers and $CeO_2$ film layers are alternately formed thereon, so that the bonding property between the film layers and between the substrate and the film layer is high to improve the resistance to cracking of the film layer and the optical properties and to prevent the degradation of the appearance and deformation of the substrate.

What is claimed is:

1. A synthetic resin half-mirror comprising a substrate made from a synthetic resin, a first film layer laminated thereon and made from SiO and at least four film layers laminated on the first film layer and alternately made from $SiO_2$ and $CeO_2$.

2. The synthetic resin half-mirror according to claim 1, wherein said first film layer of SiO has an optical thickness of $nd=\lambda/12\sim\lambda/2$ and adjoining film layer of $SiO_2$ has an optical thickness of $nd=\lambda/8\sim\lambda/4$.

3. A synthetic resin half-mirror comprising: a substrate composed of synthetic resin; a first film layer laminated on the substrate and composed of SiO; and at least four film layers successively laminated on the first film layer and on one another, the at least four film layers being alternately composed of $SiO_2$ and $CeO_2$, the lowermost film layer which is laminated on the first film layer being composed of $SiO_2$ and the uppermost film layer being composed of $CeO_2$ and defining the incident-light surface of the half-mirror.

4. A synthetic resin half-mirror according to claim 3; wherein the at least four film layers consist of four film layers.

5. A synthetic resin half-mirror according to claim 4; wherein the first film layer composed of SiO has an optical thickness in the range $nd=\lambda/12-\lambda/2$, and the lowermost film layer composed of $SiO_2$ has an optical thickness in the range $nd=\lambda/8-\lambda/4$.

6. A synthetic resin half-mirror according to claim 5; wherein the four film layers alternately composed of $SiO_2$ and $CeO_2$ each have an optical thickness $nd=\lambda/4$.

7. A synthetic resin half-mirror according to claim 3; wherein the at least four film layers consist of six film layers.

8. A synthetic resin half-mirror according to claim 7; wherein the first film layer composed of SiO has an optical thickness in the range $nd=\lambda/12-\lambda/2$, and the lowermost film layer composed of $SiO_2$ has an optical thickness in the range $nd=\lambda/8-\lambda/4$.

9. A synthetic resin half-mirror according to claim 8; wherein the six film layers alternately composed of $SiO_2$ and $CeO_2$ each have an optical thickness $nd=\lambda/4$.

10. A synthetic resin half-mirror according to claim 3; wherein the first film layer composed of SiO has an optical thickness in the range nd-32 $\lambda/12-\lambda/2$, and the lowermost film layer composed of $SiO_2$ has an optical thickness in the range $nd=\lambda/8-\lambda/4$.

11. A synthetic resin half-mirror according to claim 10; wherein the at least four film layers alternately composed of $SiO_2$ and $CeO_2$ each have an optical thickness $nd=\lambda/4$.

12. A synthetic resin half-mirror according to claim 3; wherein the film layers exhibit a spectral reflectance of not less than 40% for light incident on the incident-light surface at an incident angle of 45°.

* * * * *